(12) United States Patent
Ohmi et al.

(10) Patent No.: US 7,994,063 B2
(45) Date of Patent: Aug. 9, 2011

(54) METHOD FOR MANUFACTURING SEMICONDUCTOR DEVICE AND METHOD FOR CLEANING SEMICONDUCTOR SUBSTRATE

(75) Inventors: Tadahiro Ohmi, Sendai (JP); Akinobu Teramoto, Sendai (JP); Rui Hasebe, Sakai (JP); Masayuki Miyashita, Sakai (JP)

(73) Assignees: National University Corporation Tohoku University, Miyagi (JP); Stella Chemifa Corporation, Osaka (JP)

( * ) Notice: Subject to any disclaimer, the term of this patent is extended or adjusted under 35 U.S.C. 154(b) by 0 days.

(21) Appl. No.: 12/988,007

(22) PCT Filed: Apr. 10, 2009

(86) PCT No.: PCT/JP2009/057316
§ 371 (c)(1),
(2), (4) Date: Oct. 15, 2010

(87) PCT Pub. No.: WO2009/128392
PCT Pub. Date: Oct. 22, 2009

(65) Prior Publication Data
US 2011/0034037 A1 Feb. 10, 2011

(30) Foreign Application Priority Data
Apr. 17, 2008 (JP) .................................. 2008-108182

(51) Int. Cl.
*H01L 21/30* (2006.01)

(52) U.S. Cl. .. 438/704; 438/906; 134/1.2; 257/E21.228; 257/E21.229

(58) Field of Classification Search .................. 438/704, 438/906; 134/1.2; 257/E21.228, E21.229
See application file for complete search history.

(56) References Cited

U.S. PATENT DOCUMENTS

| 5,505,785 | A * | 4/1996 | Ferrell ............................... 134/1 |
| 6,033,993 | A * | 3/2000 | Love et al. ..................... 438/745 |
| 6,828,226 | B1 * | 12/2004 | Chen et al. ..................... 438/626 |
| 7,479,460 | B2 * | 1/2009 | Pagliaro, Jr. ................... 438/745 |
| 2002/0157686 | A1 * | 10/2002 | Kenny et al. ................... 134/1.3 |
| 2003/0051742 | A1 * | 3/2003 | Boyers ............................. 134/30 |
| 2003/0171239 | A1 * | 9/2003 | Patel et al. ..................... 510/406 |
| 2006/0017154 | A1 * | 1/2006 | Eguchi et al. ................. 257/701 |
| 2006/0183248 | A1 * | 8/2006 | Small ............................... 438/1 |
| 2006/0183654 | A1 * | 8/2006 | Small ............................. 510/165 |
| 2007/0010411 | A1 * | 1/2007 | Amemiya et al. ............ 510/175 |
| 2009/0004608 | A1 * | 1/2009 | Sawada et al. ................ 430/325 |
| 2009/0011227 | A1 * | 1/2009 | Furukawa ..................... 428/336 |
| 2009/0042400 | A1 * | 2/2009 | Pagliaro, Jr. .................. 438/745 |
| 2009/0229637 | A1 * | 9/2009 | Yun et al. ......................... 134/21 |
| 2010/0196702 | A9 * | 8/2010 | Furukawa ..................... 428/336 |
| 2011/0034037 | A1 * | 2/2011 | Ohmi et al. ................... 438/778 |

FOREIGN PATENT DOCUMENTS

| JP | 11-57636 | 3/1999 |
| JP | 11-251275 | 9/1999 |
| JP | 2002-110613 | 4/2002 |
| JP | 2003-311226 | 11/2003 |
| WO | 2006/009003 | 1/2006 |

OTHER PUBLICATIONS

W. Kern et al., Cleaning Solutions Based on Hydrogen Peroxide for use in Silicon Semiconductor Technology, RCA Review, No. 31, pp. 187-207, 1970.

* cited by examiner

*Primary Examiner* — George Fourson
(74) *Attorney, Agent, or Firm* — Morgan, Lewis & Bockius LLP

(57) ABSTRACT

Disclosed is a method for cleaning a semiconductor substrate that can solve a problem of a conventional cleaning method which should include at least five steps for cleaning a substrate such as a semiconductor substrate. The method for cleaning a semiconductor substrate comprises a first step of cleaning a substrate with ultrapure water containing ozone, a second step of cleaning the substrate with ultrapure water containing a surfactant, and a third step of removing an organic compound derived from the surfactant, with a cleaning liquid containing ultrapure water and 2-propanol. After the third step, plasma of noble gas such as krypton is applied to the substrate to further remove the organic compound derived from the surfactant.

24 Claims, 1 Drawing Sheet

US 7,994,063 B2

METHOD FOR MANUFACTURING SEMICONDUCTOR DEVICE AND METHOD FOR CLEANING SEMICONDUCTOR SUBSTRATE

This is a U.S. National Phase Entry of PCT Application No. PCT/JP2009/057316, filed Apr. 10, 2009, with a priority date of Apr. 17, 2008, based upon Japanese Patent Application No. 2008-108182.

TECHNICAL FIELD

This invention relates to a method for manufacturing a semiconductor device such as a semiconductor integrated circuit and, more specifically, relates to a method for cleaning a semiconductor substrate. This invention particularly relates to a gate insulating film forming preprocess that can obtain an ultraclean semiconductor surface with less number of steps as compared with a conventional preprocess.

BACKGROUND ART

There has been continuous progress in miniaturization and integration of a semiconductor integrated circuit formed on a semiconductor substrate. In order to achieve the miniaturization and integration, a substrate surface should be kept ultraclean. That is, organic compounds, metal, various particles, and oxides (oxide film) should be removed from the substrate surface and, for that purpose, substrate cleaning is carried out.

Conventionally, as a cleaning method for the substrate surface, RCA cleaning described in Non-Patent Document 1 was predominantly used. However, since this RCA cleaning uses a large amount of a high-temperature and high-concentration chemical solution and comprises a very large number of steps, there are concerns about the productivity and cost and even about the influence on environment.

In view of this, there have been proposed various cleaning methods in place of the RCA cleaning. For example, Patent Document 1 proposes a cleaning method comprising a first step of carrying out cleaning with ultrapure water containing ozone, a second step of carrying out cleaning with a cleaning liquid containing hydrofluoric acid, ultrapure water, and a surfactant while applying vibration at a frequency of 500 kHz or more, a third step of carrying out cleaning with ultrapure water containing ozone, a fourth step of carrying out cleaning with a cleaning liquid containing hydrofluoric acid and ultrapure water for removing an oxide film, and a fifth step of carrying out cleaning with ultrapure water.

According to the cleaning method described in Patent Document 1, all the steps are carried out at room temperature and it is possible to carry out the cleaning with less number of steps than RCA.

This cleaning method can remove an organic compound and a part of metals in the first step and can remove particles, the metals, and an oxide film in the second step.

Thus, the necessary cleaning is completed through the first and second steps. However, since the surfactant used in the second step remains on a substrate surface, the cleaning with ultrapure water containing ozone should be carried out again in the third step.

The surfactant can be removed by the cleaning with ozone-containing ultrapure water, but it is to be noted that an oxide film is formed on the surface. In order to remove this oxide film, the cleaning with the cleaning liquid containing hydrofluoric acid and ultrapure water is carried out and then the final cleaning with ultrapure water is carried out.

As described above, the cleaning method of Patent Document 1 has the problem that the superfluous step of cleaning is necessary by using ultrapure water so as to further clean new contamination resulting from the cleaning.

On the other hand, the inventors of this application have previously proposed, in Patent Document 2, a method for treating a semiconductor substrate with an aqueous solution containing alcohol (e.g. 2-propanol) and ketone and then removing the alcohol and ketone adhering to a semiconductor surface. The present inventors have made it clear that, by the treatment with the aqueous solution containing alcohol as described above, it is possible to suppress a dissolution amount of semiconductor atoms into the treatment solution and, as a result, the surface with a small surface roughness can be obtained. Further, the present inventors have also proposed to remove the alcohol adhering to the semiconductor surface by a treatment with xenon gas plasma.

Prior Art Document

Patent Document
  Patent Document 1: JP-A-H11-57636
  Patent Document 2: WO2006/009003
Non-Patent Document
  Non-Patent Document 1: W. Kern et al. RCA Rev., No. 31, p 187, 1970

DISCLOSURE OF THE INVENTION

Problem to be Solved by the Invention

This invention has been made in view of the above-mentioned problem and seeks to provide a semiconductor substrate cleaning method that can obtain an ultraclean semiconductor surface with a reduced number of steps even as compared with Patent Document 1.

Further, this invention seeks to provide a semiconductor device manufacturing method having a gate insulating film forming pretreatment process that can obtain an ultraclean semiconductor surface with less number of steps as compared with a conventional pretreatment process.

Further, this invention seeks to provide a cleaning method that can even remove an organic compound derived from a surfactant.

Means for Solving the Problem

As a result of intensive studies to solve the above-mentioned conventional problems, the present inventors have found a gate insulating film forming pretreatment process that can obtain an ultraclean semiconductor surface with a reduced number of steps even as compared with Patent Document 1 by employing the following structure, and have completed this invention.

Specifically, a semiconductor device manufacturing method according to this invention is characterized by performing a first step of cleaning, with ultrapure water containing ozone, a semiconductor surface of a substrate of which at least the surface is a semiconductor, a second step of cleaning the surface with a cleaning liquid containing hydrofluoric acid, hydrogen peroxide, ultrapure water, and a surfactant while applying vibration at a frequency of 500 kHz or more, a third step of cleaning the surface with a cleaning liquid containing 2-propanol and ultrapure water, and then a gate insulating film forming step after irradiation of plasma of a noble gas. Herein, there is no need to carry out cleaning with ultrapure water between the first step and the second step and, further, there is no need to carry out cleaning with ultrapure water even after the third step.

In this invention, the cleaning with ultrapure water containing ozone is first carried out (first step). In this first step, organic compounds and most of metals are removed. By performing this first step, it is possible to reduce variation in surface roughness after all the cleaning steps.

After the first step, the cleaning with the cleaning liquid containing hydrofluoric acid, hydrogen peroxide, ultrapure water, and surfactant of the second step can be started without carrying out the cleaning with ultrapure water as described above. In other words, it is possible to omit one ultrapure water cleaning step. What remains on the substrate surface after the first step is ozone-containing ultrapure water and thus there is no adverse influence even if the second step is started with the ozone-containing ultrapure water remaining on the substrate surface as it is. In this event, the ozone concentration is preferably 2 ppm to 50 ppm. If it is less than 2 ppm, the removal of metal becomes insufficient, while if it exceeds 50 ppm, the roughness of the substrate surface becomes significant.

The second step is the cleaning with the cleaning liquid containing hydrofluoric acid, hydrogen peroxide, ultrapure water, and surfactant while applying vibration at a frequency of 500 kHz or more and, by this cleaning, it is possible to remove particles and metals in an oxide film. Further, an increase in surface roughness can be made extremely small. The surfactant is preferably a nonionic surfactant in terms of surface tension reduction and solubility.

The concentration of the surfactant is preferably 10 ppm to 500 ppm. If it is less than 10 ppm, re-adhesion of particles becomes significant. If it is greater than 500 ppm, the micellized surfactant hinders the cleaning.

It is preferable that hydrogen be contained at 0.01 ppm to 1.6 ppm in the ultrapure water in the second step. This is because the particle removal efficiency increases by the addition of hydrogen. If the hydrogen concentration is smaller than 0.01 ppm, the particle removal efficiency decreases. On the other hand, it is difficult to dissolve the hydrogen at the concentration greater than 1.6 ppm in the ultrapure water.

The hydrofluoric acid concentration in the second step is preferably 0.1% to 3%. If it is less than 0.1%, an oxide film cannot be sufficiently etched, while if it is greater than 3%, the surface roughness is adversely affected.

The hydrogen peroxide concentration in the second step is preferably 0.1% to 10%. If it is less than 0.1%, the metal removal efficiency decreases, while if it is greater than 10%, the surface is oxidized.

The third step is the cleaning with the cleaning liquid containing 2-propanol and ultrapure water. Using the 2-propanol, it is possible to remove most of the surfactant remaining in the second step. Further, as described in Patent Document 2, an increase in substrate surface roughness can be made extremely small by the cleaning with the cleaning liquid containing 2-propanol and ultrapure water.

The 2-propanol concentration is preferably 30% to 50%. If it is less than 30%, an increase in substrate surface roughness cannot be sufficiently suppressed. On the other hand, even if it is greater than 50%, there is observed no more effect than a certain level. In addition, if the concentration is high, the viscosity of the chemical solution becomes high and further a disadvantage occurs in terms of cost, and therefore, it can be said that 30% to 50% is optimal.

After the third step, the semiconductor integrated circuit substrate is dried by rotation and transferred into a chamber for gate insulating film formation. Then, the surfactant (organic compounds derived from the surfactant) on the substrate surface can be completely removed by irradiation of plasma of a noble gas before the gate insulating film formation.

The surfactant removal effect has been observed when either one of helium, argon, krypton, and xenon has been used as the noble gas, but since krypton plasma is optimal for the gate insulating film formation thereafter, the plasma irradiation of the krypton gas is convenient.

Effect of the Invention

According to this invention, there are obtained a cleaning method and a semiconductor device manufacturing method each capable of removing, by noble gas plasma, not only an organic compound that cannot be removed by a preceding cleaning step, but also hydrogen terminating a surface.

MODE FOR CARRYING OUT THE INVENTION

Figure 1:
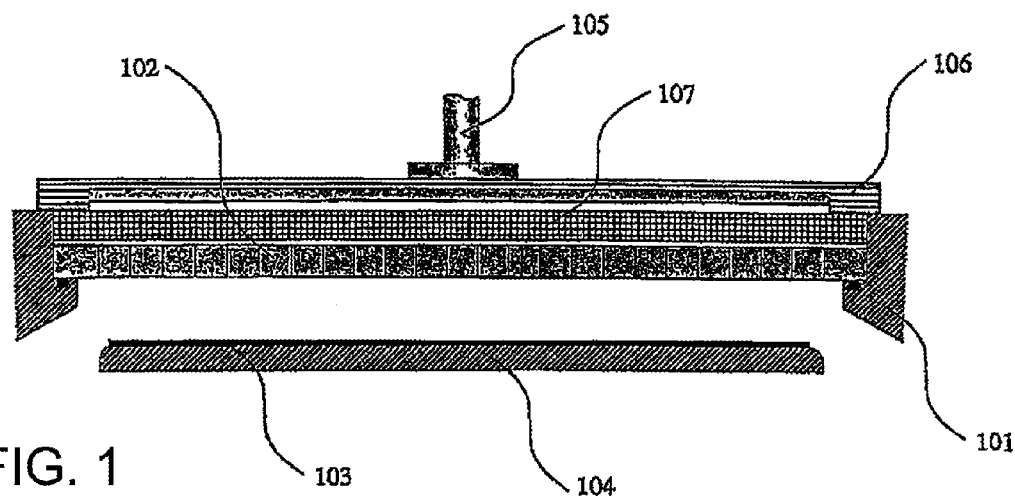
FIG. 1 is an exemplary cross-sectional view of a plasma processing apparatus used in an Example of this invention.

Hereinbelow, a preferred embodiment of this invention will be illustratively described in detail. Kinds of gases, cleaning liquid concentrations, and so on described in Examples thereof are not intended to limit the scope of this invention only thereto and are merely explanatory examples unless otherwise stated specifically.

CLEANING METHOD OF EXAMPLE 1 AND CLEANING METHOD OF COMPARATIVE EXAMPLE 1

A silicon (100) substrate (size; 8 inches, resistance value; 1 to 1000 $\Omega\cdot$cm) manufactured by a Cz (Czochralski) method was immersed in a chemical solution obtained by diluting ICP-MS Multi-Element Standard Solution IV (manufactured by MERCK Co., Ltd.) 20 times with ultrapure water, thereby causing Fe, Ni, and Cu to adhere to a silicon wafer surface at about $10^{13}/cm^2$, respectively.

Like in Example 1, there was prepared a silicon wafer for use in a cleaning method of Comparative Example 1 and then Fe, Ni, and Cu were caused to adhere also to a surface of this silicon wafer at about $10^{13}/cm^2$, respectively.

The above-mentioned metal-contaminated wafers were respectively cleaned by the method of Example 1 and the method of Comparative Example 1 which will be described below. Table 1 shows the results of measuring the concentrations of Fe, Ni, and Cu on the silicon wafer surfaces using a total reflection fluorescent X-ray analysis apparatus after the cleaning.

Cleaning Method of Example 1

Cleaning with ultrapure water containing ozone (5 ppm) was carried out for 5 minutes (first step) and thereafter, cleaning with a cleaning liquid which contains ultrapure water to which hydrofluoric acid (0.5%), hydrogen peroxide (1%), and hydrogen (1.2 ppm) are added, together with a surfactant (50 ppm) was carried out for 10 minutes while applying vibration at a frequency of 900 kHz (second step), and cleaning with a cleaning liquid containing 30% 2-propanol and ultrapure water was carried out for 10 minutes (third step).

Cleaning Method of Comparative Example 1

Cleaning with ultrapure water containing ozone (5 ppm) was carried out for 5 minutes (first step), cleaning with a cleaning liquid which contains ultrapure water to which hydrofluoric acid (0.5%), hydrogen peroxide (1%), and hydrogen (1.2 ppm), together with a surfactant (50 ppm) was carried out for 10 minutes while applying vibration at a frequency of 900 kHz (second step), cleaning with ultrapure water containing ozone (5 ppm) was carried out for 5 minutes (third step), cleaning with a cleaning liquid containing hydrofluoric acid (0.5%) and ultrapure water was carried out for 1 minute (fourth step), and cleaning with ultrapure water was carried out for 10 minutes (fifth step).

TABLE 1

|  | Example 1 | | | Comparative Example 1 | | |
| --- | --- | --- | --- | --- | --- | --- |
|  | Fe | Ni | Cu | Fe | Ni | Cu |
| Before Cleaning | $10^{13}$ | $10^{13}$ | $10^{13}$ | $10^{13}$ | $10^{13}$ | $10^{13}$ |
| After Cleaning | $<10^9$ | $<10^9$ | $<10^9$ | $<10^9$ | $<10^9$ | $<10^9$ | unit: atoms/cm$^2$

As is clear from Table 1, it is seen that the metal impurities on the wafer surfaces were removed to a range below the detection limit both in the case where the cleaning was carried out by the five steps as in Comparative Example 1 and in the three-step cleaning method (Example 1) according to this invention wherein, in the five-step cleaning method of Comparative Example 1, the third step of cleaning with ultrapure water containing ozone and the fourth step of cleaning with the cleaning liquid containing hydrofluoric acid and ultrapure water were excluded and the final step was replaced by the cleaning with the cleaning liquid containing 30% 2-propanol and ultrapure water. That is, in a semiconductor integrated circuit manufacturing method according to Example 1 of this invention, the metal impurities were sufficiently removed like in Comparative Example 1 comprising the five steps.

CLEANING METHOD OF EXAMPLE 2 AND CLEANING METHOD OF COMPARATIVE EXAMPLE 2

Preparation was made about a chemical solution in which silicon nitride powder; SiN (Alfa Aesar SiN (IV) alpha phase 99.9% manufactured by Johnson Matthey Japan Incorporated) was dissolved in ultrapure water.

Silicon (100) substrates (size; 8 inches, resistance value; 1 to 100 Ω·cm) manufactured by the Cz method were immersed in the above-mentioned SiN-contaminated chemical solution, thereby causing about 3000 SiN particles to adhere to each of silicon surfaces.

The above-mentioned SiN-contaminated wafers were respectively cleaned by the following methods (cleaning method of Example 2) and (cleaning method of Comparative Example 2). Table 2 shows the results of measuring the number of SiN particles on the silicon wafer surfaces using a wafer surface foreign matter inspection apparatus (minimum measurable particle size; 0.079 µm) after the cleaning.

Cleaning Method of Example 2

Cleaning with ultrapure water containing ozone (5 ppm) was carried out for 5 minutes (first step) and cleaning with a cleaning liquid which contains ultrapure water including hydrofluoric acid (0.5%), hydrogen peroxide (1%), and hydrogen (1.2 ppm), together with a surfactant (50 ppm) was carried out for 10 minutes while applying vibration at a frequency of 900 kHz (second step), and cleaning with a cleaning liquid containing 30% 2-propanol and ultrapure water was carried out for 10 minutes (third step).

Cleaning Method of Comparative Example 2

Cleaning with ultrapure water containing ozone (5 ppm) was carried out for 5 minutes (first step), cleaning with a cleaning liquid containing hydrofluoric acid (0.5%), hydrogen peroxide (1%), ultrapure water added with hydrogen (1.2 ppm), and a surfactant (50 ppm) was carried out for 10 minutes while applying vibration at a frequency of 900 kHz (second step), cleaning with ultrapure water containing ozone was carried out for 5 minutes (third step), cleaning with a cleaning liquid containing hydrofluoric acid (0.5%) and ultrapure water was carried out for 1 minute (fourth step), and cleaning with ultrapure water was carried out for 10 minutes (fifth step).

TABLE 2

|  | Example 2 | | Comparative Example 2 | |
| --- | --- | --- | --- | --- |
|  | $\geqq 0.079$ µm | $\geqq 0.2$ µm | $\geqq 0.079$ µm | $\geqq 0.2$ µm |
| Before Cleaning | 2809 | 874 | 2828 | 927 |
| After Cleaning | 49 | 6 | 262 | 13 | unit: particles/wafer

As is clear from the numbers of SiN particles on the silicon wafer surfaces in Example 2 and Comparative Example 2 shown in Table 2, it is seen that, as compared with the cleaning method of the five steps shown in Comparative Example 2, the particles on the wafer surface were reduced in the cleaning method according to Example 2 of this invention wherein, in the five-step cleaning method of Comparative Example 2, the third step of cleaning with ultrapure water containing ozone and the fourth step of cleaning with the cleaning liquid containing hydrofluoric acid and ultrapure water were excluded and the final step was replaced by the cleaning with the cleaning liquid containing 30% 2-propanol and ultrapure water. This is presumably because since the number of steps was reduced, contamination or the like during transfer was reduced. That is, in a semiconductor integrated circuit manufacturing method according to this invention, it is possible to realize a highly clean wafer surface with less SiN particles than in the conventional method.

Then, a surfactant left on a silicon wafer surface was analized by measurement using a thermal desorption system-atmospheric pressure ionization mass spectrometer (TDS-APIMS). The sampling area was set to 86.6 cm$^2$ and argon was caused to flow as a carrier gas at 1.2 L/min. The heating rate of a wafer was set to 30° C./min. By measuring fragments with a mass-to-charge ratio of 45 using the APIMS, the residual amount of the surfactant was comparatively evaluated.

Hereinbelow, an oxide film forming pretreatment using plasma will be described. FIG. 1 is a cross-sectional view showing one example of a plasma processing apparatus using a radial line slot antenna, which is used in this invention.

The plasma processing apparatus shown in FIG. 1 comprises a vacuum vessel 101, a shower plate 102 disposed in the vacuum vessel 101, a sample stage 104 for supporting a silicon substrate 103, a coaxial waveguide 105, a line slot antenna 106, and a dielectric plate 107.

In FIG. 1, first, the inside of the vacuum vessel (process chamber) 101 is evacuated and, then, while first introducing a krypton gas from the shower plate 102, the pressure in the process chamber 101 is set to about 133 Pa (1 Torr).

The silicon substrate 103 is placed on the sample stage 104 having a heating mechanism (not illustrated), where the temperature of the sample is set to about 400° C. When the temperature of the silicon substrate 103 is in the range of 200 to 550° C., the results described below will be almost the same.

Since the silicon substrate 103 was cleaned with hydrofluoric acid or a cleaning liquid containing hydrofluoric acid, hydrogen peroxide, and a surfactant in a pretreatment cleaning step carried out immediately before, dangling bonds on a silicon surface are terminated with hydrogen.

Then, a microwave having a frequency of 2.45 GHz is supplied to the radial line slot antenna 106 through the coaxial waveguide 105 so that the microwave is introduced into the process chamber 101 from the radial line slot antenna 106 through the dielectric plate 107 provided in part of a wall surface of the process chamber 101.

The introduced microwave excites the krypton gas introduced into the process chamber 101 from the shower plate 102 and, as a result, high-density krypton plasma is formed just under the shower plate 102.

When the frequency of the supplied microwave is in the range of about 900 MHz or more to about 10 GHz or less, the results described below will be almost the same.

In the structure of FIG. 1, the distance between the shower plate 102 and the silicon substrate 103 is set to 5 cm in this Example. As this distance decreases, faster film formation is enabled. In this Example, the results of using the plasma apparatus using the radial line slot antenna are shown, but a microwave may be introduced into a process chamber using another method to thereby excite plasma.

In this Example, the output of the microwave was set to 3500 W and the irradiation time of the krypton plasma was set to 10 seconds.

CLEANING METHOD OF EXAMPLES 3, 4 AND CLEANING METHODS OF COMPARATIVE EXAMPLES 3 to 5

Table 3 shows the results of carrying out the TDS-APIMS measurement after cleaning 8-inch silicon (100) wafers by five cleaning methods of the following conditions, respectively.

Cleaning Method of Example 3

Cleaning Method of Carrying Out a Plasma Treatment After Three-step Cleaning

Cleaning with ultrapure water containing ozone (5 ppm) was carried out for 5 minutes (first step) and then, cleaning with a cleaning liquid containing ultrapure water which includes hydrofluoric acid (0.5%), hydrogen peroxide (1%), and hydrogen (1.2 ppm), together with a surfactant (50 ppm) was carried out for 10 minutes while applying vibration at a frequency of 900 kHz (second step). Subsequently, cleaning with a cleaning liquid containing 2-propanol (30%) and ultrapure water was carried out for 10 minutes (third step).

Thereafter, irradiation of krypton plasma was performed for 10 seconds in the above-mentioned plasma processing apparatus.

Cleaning Method Of Comparative Example 3

Five-step Cleaning

Cleaning with ultrapure water containing ozone (5 ppm) was carried out for 5 minutes (first step), cleaning with a cleaning liquid containing ultrapure water which includes hydrofluoric acid (0.5%), hydrogen peroxide (1%), and hydrogen (1.2 ppm), together with a surfactant (50 ppm) was carried out for 10 minutes while applying vibration at a frequency of 900 kHz (second step), cleaning with ultrapure water containing ozone (5 ppm) was carried out for 5 minutes (third step), cleaning with a cleaning liquid containing hydrofluoric acid (0.5%) and ultrapure water was carried out for 1 minute (fourth step), and cleaning with ultrapure water was carried out for 10 minutes (fifth step).

Cleaning Method of Comparative Example 4

Three-step Cleaning

Cleaning with ultrapure water containing ozone (5 ppm) was carried out for 5 minutes (first step), cleaning with a cleaning liquid containing ultrapure water which includes hydrofluoric acid (0.5%), hydrogen peroxide (1%), and hydrogen (1.2 ppm), together with a surfactant (50 ppm) was carried out for 10 minutes while applying vibration at a frequency of 900 kHz (second step), and cleaning with ultrapure water was carried out for 10 minutes (third step). The cleaning method of Comparative Example 4 differs from Example 3 in that only ultrapure water was used in the third step and that the plasma irradiation was not carried out.

Cleaning Method of Example 4

Three-step Cleaning

Cleaning with ultrapure water containing ozone (5 ppm) was carried out for 5 minutes (first step), cleaning with a cleaning liquid containing ultrapure water which includes hydrofluoric acid (0.5%), hydrogen peroxide (1%), and hydrogen (1.2 ppm), together with a surfactant (50 ppm) was carried out for 10 minutes while applying vibration at a frequency of 900 kHz (second step), and cleaning with a cleaning liquid containing 2-propanol (30%) and ultrapure water was carried out for 10 minutes (third step). Example 4 differs from Example 3 in that the plasma treatment was not carried out.

Cleaning Method of Comparative Example 5

Cleaning with ultrapure water containing ozone (5 ppm) was carried out for 5 minutes (first step), cleaning with a cleaning liquid containing ultrapure water which includes hydrofluoric acid (0.5%), hydrogen peroxide (1%), and hydrogen (1.2 ppm), together with a surfactant (50 ppm) was carried out for 10 minutes while applying vibration at a frequency of 900 kHz (second step), and cleaning with ultrapure water was carried out for 10 minutes (third step). Thereafter, krypton plasma was irradiated for 10 seconds in the above-mentioned plasma processing apparatus. Comparative Example 5 differs from Example 3 in that ultrapure water alone was used in the third step.

TABLE 3

| | Example 3 | Comparative Example 3 | Comparative Example 4 | Example 4 | Comparative Example 5 |
|---|---|---|---|---|---|
| Before Treatment | 0.01% | 0.01% | 0.01% | 0.01% | 0.01% |
| After Treatment | 0.01% | 0.01% | 0.6% | 0.09% | 0.06% |

In Comparative Example 3, there was no change in the amount of organic compound on a wafer surface before and after the treatment. On the other hand, in Comparative Example 4 comprising the three steps that carried out the final cleaning with ultrapure water, the organic compound was detected as much as about 60 times as compared with Comparative Example 3. Accordingly, it is seen that the organic compound was not removed even by carrying out the cleaning only with ultrapure water after the cleaning with the cleaning liquid containing the surfactant.

In three-step Example 4 that carried out the final cleaning with the cleaning liquid containing ultrapure water and 2-propanol, it was possible to reduce the organic compound derived from the surfactant to 0.09% as compared with Comparative Example 4.

On the other hand, in Comparative Example 5 that carried out the plasma irradiation after the final cleaning with ultrapure water, the organic compound derived from the surfactant was only removed to about 0.06% even by carrying out the plasma irradiation. On the other hand, in Example 4, although the plasma irradiation was not carried out, it was possible to significantly remove the organic compound as compared with Comparative Example 4 using only ultrapure water. Further, in Example 3, the residual amount of the organic compound was on the same level as in Comparative Example 3 and there was no change before and after the treatment.

That is, it has been found that it is possible to prevent a surfactant from remaining and to obtain the same effect as that of the conventional five-step cleaning method only by irradiation of krypton plasma after a first step of carrying out cleaning with ultrapure water containing ozone, a second step of carrying out cleaning with a cleaning liquid containing hydrofluoric acid, hydrogen peroxide, ultrapure water, and a surfactant while applying vibration at a frequency of 500 kHz or more, and a third step of carrying out cleaning with a cleaning liquid containing 2-propanol and ultrapure water.

Krypton was used as a noble gas in this Example, but the same effect can be obtained using helium, argon, or xenon.

In this Example, the output of the microwave was set to 3500 W and the plasma irradiation time was set to 10 seconds. However, any combination of output and irradiation time will do as long as it can completely remove the surfactant.

Figure 2:
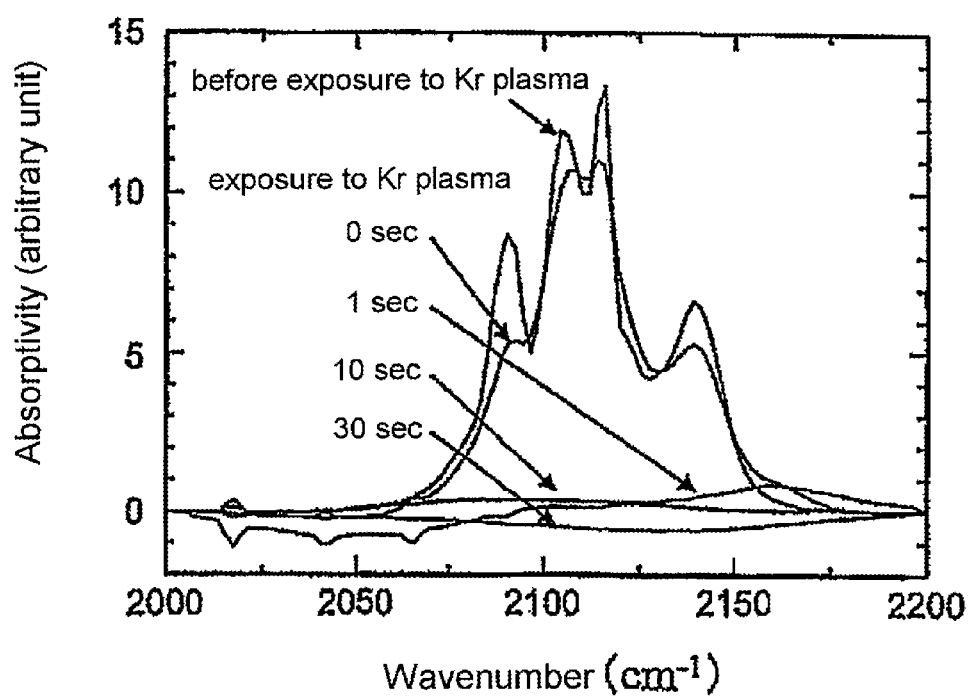
FIG. 2 is a graph showing the relationship between irradiation time of krypton plasma and removal of hydrogen termination on a silicon surface.

Further, by carrying out the plasma irradiation, it is possible to remove terminating hydrogen on the silicon wafer surface along with the surfactant. FIG. 2 shows the results of measuring the hydrogen termination removal effect on a silicon surface under the conditions of this Example by the FTIR-ATR method (Fourier transform infrared spectroscopy-attenuated total reflectance spectroscopy).

In FIG. 2, the abscissa axis represents the wavenumber ($cm^{-1}$) and the ordinate axis represents the absorptivity, wherein there is shown the relationship between irradiation time of krypton plasma and change in removal of hydrogen termination on a silicon surface.

As shown in FIG. 2, it is seen that infrared absorption around wavenumber 2100 cm-1, which specifies silicon-hydrogen bonds, almost disappeared by krypton plasma irradiation for only about 1 second and almost completely disappeared by irradiation for about 10 seconds.

As described above, by irradiation of noble gas plasma before oxide film formation, it is possible to simultaneously perform removal of a surfactant and removal of terminating hydrogen on a silicon wafer surface and thus to improve the effect of reducing the leakage current of a gate insulating film. Following the plasma irradiation, the gate insulating film is formed on the cleaned surface in the same plasma processing apparatus. The formation of the gate insulating film can include one or both of a step of forming an oxide film by directly oxidizing a semiconductor surface using plasma of krypton and oxygen and a step of forming a nitride film by directly nitriding a semiconductor surface using plasma of a gas containing a noble gas such as krypton and nitrogen. A high-permittivity insulating film may further be deposited thereon by plasma CVD or the like.

INDUSTRIAL APPLICABILITY

This invention is applicable not only to a manufacturing method for a semiconductor device having a gate insulating film, but also to manufacturing methods for various substrates that require cleaning.

DESCRIPTION OF SYMBOLS 101 vacuum vessel (process chamber)
102 shower plate
103 silicon substrate
104 sample stage
105 coaxial waveguide
106 radial line slot antenna
107 dielectric plate

The invention claimed is:

1. A semiconductor device manufacturing method comprising performing a first step of cleaning, with ultrapure water containing ozone, a semiconductor surface of a substrate of which at least the surface is a semiconductor, a second step of cleaning the surface with a cleaning liquid containing hydrofluoric acid, hydrogen peroxide, ultrapure water, and a surfactant while applying vibration at a frequency of 500 kHz or more, a third step of cleaning the surface with a cleaning liquid containing 2-propanol and ultrapure water, and then a step of forming a gate insulating film on the surface after irradiation of plasma of a noble gas onto the surface.

2. The semiconductor device manufacturing method according to claim 1, wherein hydrogen is added to the ultrapure water in the second step.

3. The semiconductor device manufacturing method according to claim 2, wherein the concentration of the hydrogen added to the ultrapure water in the second step falls within a range of 0.01 ppm to 1.6 ppm.

4. The semiconductor device manufacturing method according to claim 1, wherein the surfactant in the second step is a nonionic surfactant.

5. The semiconductor device manufacturing method according to claim 1, wherein the concentration of the surfactant in the second step is 10 ppm to 500 ppm.

6. The semiconductor device manufacturing method according to claim 1, wherein the concentration of the hydrofluoric acid in the second step is 0.1% to 3%.

7. The semiconductor device manufacturing method according to claim 1, wherein the concentration of the hydrogen peroxide in the second step is 0.1% to 10%.

8. The semiconductor device manufacturing method according to claim 1, wherein the ozone concentration in the ultrapure water containing the ozone in the first step is in a range of 2 ppm to 50 ppm.

9. The semiconductor device manufacturing method according to claim 1, wherein the concentration of the 2-propanol in the third step is 30% to 50%.

10. The semiconductor device manufacturing method according to claim 1, comprising removing organic compound derived from the surfactant remaining on the surface, by the irradiation of the plasma of the noble gas.

11. The semiconductor device manufacturing method according to claim 10, comprising removing terminating hydrogen on the surface by the irradiation of the plasma of the noble gas.

12. The semiconductor device manufacturing method according to claim 1, wherein the noble gas is at least one of krypton, argon, and xenon.

13. The semiconductor device manufacturing method according to claim 11, wherein the noble gas is krypton.

14. A semiconductor substrate cleaning method comprising a first step of carrying out cleaning with ultrapure water containing ozone, a second step of carrying out cleaning with a cleaning liquid containing hydrofluoric acid, hydrogen peroxide, ultrapure water, and a surfactant while applying vibration at a frequency of 500 kHz or more, and a third step of carrying out cleaning with a cleaning liquid containing 2-propanol and ultrapure water.

15. The semiconductor substrate cleaning method according to claim 14, wherein hydrogen is added to the ultrapure water in the second step.

16. The semiconductor substrate cleaning method according to claim 15, wherein the concentration of the hydrogen added to the ultrapure water in the second step is in a range of 0.01 ppm to 1.6 ppm.

17. The semiconductor substrate cleaning method according to claim 14, wherein the surfactant in the second step is a nonionic surfactant.

18. The semiconductor substrate cleaning method according to claim 14, wherein the concentration of the surfactant in the second step is 10 ppm to 500 ppm.

19. The semiconductor substrate cleaning method according to claim 14, wherein the concentration of the hydrofluoric acid in the second step is 0.1% to 3%.

20. The semiconductor substrate cleaning method according to claim 14, wherein the concentration of the hydrogen peroxide in the second step is 0.1% to 10%.

21. The semiconductor substrate cleaning method according to claim 14, wherein the ozone concentration in the ultrapure water containing the ozone in the first step is in a range of 2 ppm to 50 ppm.

22. The semiconductor substrate cleaning method according to claim 14, wherein the concentration of the 2-propanol in the third step is 30% to 50%.

23. A cleaning method comprising cleaning a semiconductor substrate with a cleaning liquid containing a surfactant and then removing the surfactant remaining on the semiconductor substrate with a cleaning liquid containing 2-propanol and ultrapure water.

24. The cleaning method according to claim 23, wherein, after cleaning with the cleaning liquid containing the 2-propanol and the ultrapure water, irradiation of noble gas plasma is performed to further remove organic compound derived from the surfactant remaining on the substrate.

* * * * *